United States Patent
Hudson et al.

(10) Patent No.: US 6,916,746 B1
(45) Date of Patent: Jul. 12, 2005

(54) METHOD FOR PLASMA ETCHING USING PERIODIC MODULATION OF GAS CHEMISTRY

(75) Inventors: Eric A. Hudson, Berkeley, CA (US); James V. Tietz, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 9 days.

(21) Appl. No.: 10/411,520

(22) Filed: Apr. 9, 2003

(51) Int. Cl.[7] .............................................. H01L 21/302
(52) U.S. Cl. .................... 438/706; 438/710; 438/712; 438/714; 216/58; 216/67
(58) Field of Search .............................. 438/706, 710, 438/712, 714, 720; 216/58, 67, 68

(56) References Cited

U.S. PATENT DOCUMENTS

| | | | |
|---|---|---|---|
| 4,414,059 A | 11/1983 | Blum et al. | 156/659.1 |
| 5,498,312 A | 3/1996 | Laermer et al. | 156/643.1 |
| 5,501,893 A | 3/1996 | Laermer et al. | 428/161 |
| 6,051,503 A | 4/2000 | Bhardwaj et al. | 438/705 |
| 6,071,822 A * | 6/2000 | Donohue et al. | 438/712 |
| 6,100,200 A * | 8/2000 | Van Buskirk et al. | 438/697 |
| 6,127,273 A | 10/2000 | Laermer et al. | 438/709 |
| 6,187,685 B1 | 2/2001 | Hopkins et al. | 438/710 |
| 6,200,822 B1 | 3/2001 | Becker et al. | 438/9 |
| 6,211,092 B1 | 4/2001 | Tang et al. | 438/719 |
| 6,214,161 B1 | 4/2001 | Becker et al. | 156/345 |
| 6,261,962 B1 | 7/2001 | Bhardwaj et al. | 438/702 |
| 6,284,148 B1 | 9/2001 | Laermer et al. | 216/37 |
| 6,303,512 B1 | 10/2001 | Laermer et al. | 438/712 |
| 6,316,169 B1 | 11/2001 | Vahedi et al. | 430/329 |
| 6,387,287 B1 | 5/2002 | Hung et al. | 216/67 |
| 6,489,632 B1 | 12/2002 | Yamazaki et al. | 257/66 |
| 6,617,253 B1 | 9/2003 | Chu et al. | 438/702 |
| 6,632,903 B2 * | 10/2003 | Jung et al. | 526/269 |

FOREIGN PATENT DOCUMENTS

| | | | | |
|---|---|---|---|---|
| JP | S63-13334 | 1/1988 | | H01L/21/302 |

* cited by examiner

*Primary Examiner*—Lan Vinh
(74) *Attorney, Agent, or Firm*—Beyer Weaver & Thomas LLP (57) ABSTRACT

A method for etching a layer over a substrate is provided. A gas-modulated cyclic process is performed for more than three cycles. Each cycle comprises performing a protective layer forming phase using first gas chemistry with a deposition gas chemistry, which is performed in about 0.0055 to 7 seconds for each cycle and performing an etching phase for the feature through the etch mask using a second gas chemistry using a reactive etching gas chemistry, which is performed in about 0.005 to 14 seconds for each cycle. The protective layer forming phase comprises providing the deposition gas and forming a plasma from the deposition gas. Each etching phase comprises providing a reactive etching gas and forming a plasma from the reactive etching gas.

16 Claims, 9 Drawing Sheets

METHOD FOR PLASMA ETCHING USING PERIODIC MODULATION OF GAS CHEMISTRY

BACKGROUND OF THE INVENTION

1. Field of the Invention

The invention relates to a method of obtaining a structure on a semiconductor wafer by etching through structures defined by a mask, such as a photoresist mask, hard mask, or a stacked mask, using a plasma.

2. Description of the Related Art

Figure 1A:
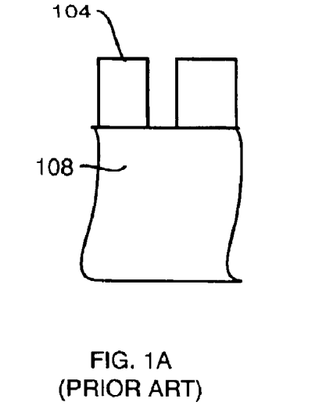
FIGS. 1A–C are schematic views of the formation of a contact hole feature through a prior art process.
Figure 1B:
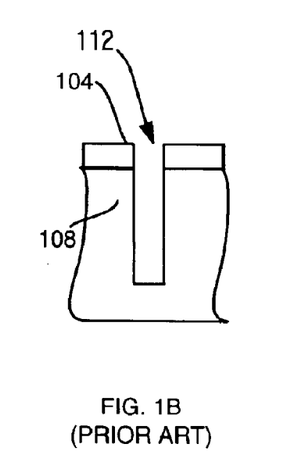
Figure 1C:
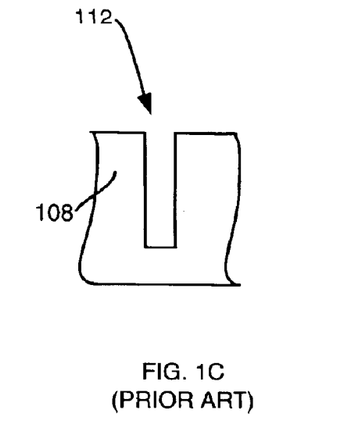

In semiconductor plasma etching applications, a plasma etcher is usually used to transfer a mask pattern into a circuit and line pattern of a desired thin film and/or filmstack (conductors or dielectric insulators) on a wafer. This is achieved by etching away the films (and filmstacks) underneath the photoresist materials in the opened areas of the mask pattern. This etching reaction may be initiated by the chemically active species and electrically charged particles (ions) generated by exciting an electric discharge in a reactant mixture contained in a vacuum enclosure also referred to as a reactor or process chamber. Additionally, the ions may be also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping them away, leaving in its place a replica of the lateral pattern of the original intended mask patterns. This etching method is illustrated in FIGS. 1A–C. In this method, a plasma etching process is used to transfer directly the photoresist mask pattern 104 into that of the underlying oxide dielectric thin film 108, as shown in FIG. 1A. The etching generates a contact hole 112 and erodes and damages the photoresist 104, as shown in FIG. 1B. The photoresist is then removed leaving the contact hole 112 in the oxide 108, as shown in FIG. 1C. During the etching process, the mask materials are usually eroded and/or damaged in exchange for the pattern transfer. Consequently, some of the damage and erosion also may be transferred to the underlying layers leaving such undesirable pattern distortions such as striation, CD enlargement, faceting, etc.

An objective of the etching methodology, therefore, may include reducing the mask erosion to enhance the fidelity of the pattern transfer from the mask patterns. For this purpose, it has been proposed to include a passivation gas in the reactive etching mixture. This passivation gas can be chosen in such a way that its presence selectively reduces the etching damage and erosion of the masking materials relative to the removal rate of the thin film materials to be etched. The passivation gas can be chosen in such a way that, an etching retardation coating is generated on the surface of the masking materials acting as a barrier to slow down the etching reaction. By design, the passivation gas is chosen in a way that it additionally beneficially forms an etching retardation coating on vertical surfaces of the film structures to be etched, such that etching reaction cannot advance in the absence of the ion bombardment. By the nature of the vertical trajectory of the charged particles, etching can therefore advance only in the vertical direction, with little to no etching in the lateral direction, creating an anisotropic etching profile. Hence, the presence of a passivation gas in the etching mixture is very important for the advantage of better etching mask protection and highly anisotropic etching profile by the use of relatively high energy directional ion bombardment.

It has already been proposed that the reactive gas mixture contain etching gases and polymer formers, with the latter acting the role of a passivation gas. In this case, the etching gases release highly reactive species by the excitation of an electrical discharge, which in turn etches the thin film materials to be etched as well as the masking materials by the mechanism of a spontaneous reaction. By the nature of spontaneous reactions, the etching reaction advances in both the vertical as well as the lateral surfaces, creating isotropic etching profiles. The co-presence of a polymer former, through generation of a polymer deposit on the surface of the etching structures and masking materials, can be used to create simultaneously high etching selectivity to masking materials and etching anisotropy, in conjunction with the ion bombardment.

It also has already been proposed that the reactive gas mixture contain polymer former gases and an etching enabler gas. The role of the etching enabler gas is to enable the etching enabler gas to release highly reactive species by reacting with the polymer former gases in the presence of an electrical discharge. Alternatively, a retardation coating on the etching materials as well as the masking materials can also be formed by chemical reaction of a properly chosen passivation gas directly with the surfaces of these materials.

A common disadvantage of the above mentioned methods is that the optimum conditions for different aspects of the etching requirement usually do not coincide and by mixing the gases some of the unique properties of each precursor gases may be lost due to inter-reactions. The etching condition optimization almost always involve complex trade-offs into a single etching condition that may not be the optimum should the different etching chemistries be separate.

A variant of the etching methodology is taught in U.S. Pat. No. 5,501,893, issued Mar. 26, 1996 to Laermer et al., entitled "Method of Anisotropically Etching Silicon". This method separates out the etching gases and polymer former gases into two different steps, each consisting purely of one type of chemicals but not the other. The deposition step taught in Laermer forms an approximately 50 nm thick Teflon-like polymer layer during a suggested one minute deposition step. This allows for fast etching rate at low ion bombardment energies, since at low ion bombardment energies, high selectivities to masking materials can be achieved for certain spontaneous etching reactions if the activation energy is slightly lower for the reaction at the surface of the etching materials than the masking materials.

By removing the polymer former from the etching process, it is believed that the etching process is isotropic during the duration when the etching is proceeding, since there is no retardation layer to prevent the lateral etching from occurring. Additionally, without the passivation gas in the etching mixture, it may be difficult to obtain sufficient etching selectivity to the masking materials if the desire is there to use higher ion energies. Many etching applications can benefit from high ion bombardment energy to obtain high aspect ratio structures in very small dimension structures, for example. It is also believed that such processes have undesirable striation and faceting.

Figure 2A:
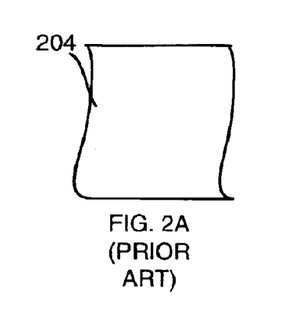
FIGS. 2A–F are schematic views of the formation of a contact hole feature through another prior art process.
Figure 2B:
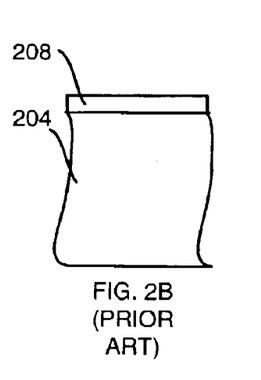
Figure 2C:
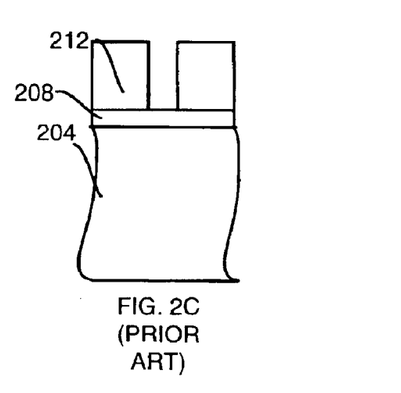
Figure 2D:
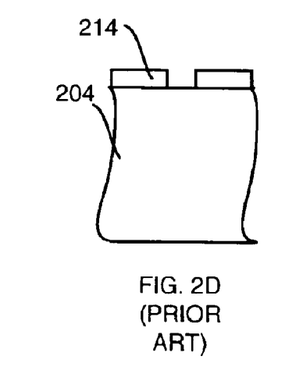
Figure 2E:
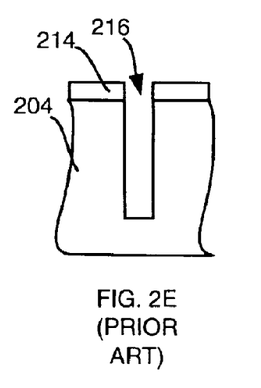
Figure 2F:
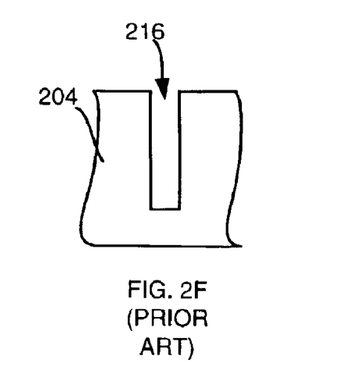

Additional proposed methods include a stacked masking scheme to improve the overall etching resistance of the masking materials. This is illustrated in FIGS. 2A–F. In FIG. 2A an oxide layer 204 is provided. FIG. 2B shows a hardmask layer 208 placed over the oxide layer. A photoresist mask 212 is placed over the hardmask layer 208, as shown in FIG. 2C. The photoresist mask 212 is used to pattern the hardmask layer 208 to create a patterned hardmask layer 214, and the photoresist layer 212 may be removed, as shown in FIG. 2D. A contact hole 216 is etched in the oxide layer 204, using the patterned hardmask layer 214 as a mask as shown in FIG. 2E. The hardmask is then removed leaving the contact 216 in the oxide layer 204, as shown in FIG. 2F.

The advantages of this method are that, by having a more inert hardmask from which to transfer patterns (circuits and lines) to the underlying films, the etch performance is much enhanced and the requirement on the etching and photolithography is also much reduced. The disadvantages of this method are that, by introducing new process steps and new tool sets into the process flow, it is of higher cost and lower overall throughput. In addition, the extra process complexity also introduces difficulties by itself. For example, the Si hardmask used for dielectric contact etch applications is not as easily stripped as the photoresist mask.

SUMMARY OF THE INVENTION

To achieve the foregoing and in accordance with the purpose of the present invention, a method for etching a feature in a layer through an etch mask over a substrate is provided. A gas-modulated cyclic process is performed for more than three cycles. Each cycle comprises performing a protective layer forming phase using first gas chemistry with a deposition gas chemistry, wherein the protective layer forming phase is performed in about 0.0055 to 7 seconds for each cycle. The protective layer forming phase comprises providing the deposition gas and forming a plasma from the deposition gas. Each cycle further comprises performing an etching phase for etching the feature through the etch mask using a second gas chemistry using a reactive etching gas chemistry, where the first gas chemistry is different than the second gas chemistry, wherein the etching phase is performed in about 0.005 to 14 seconds for each cycle. Each etching phase comprises providing a reactive etching gas and forming a plasma from the reactive etching gas.

In another embodiment an apparatus for etching a feature in a layer through an etch mask over a substrate is provided. A process chamber, within which the substrate may be placed is provided. A first gas chemistry source for providing first gas chemistry of a deposition gas chemistry is provided. A second gas chemistry source for providing a second gas chemistry of a reactive etching gas chemistry is provided. A controller controllably connected to the first gas chemistry source and the second gas chemistry source, where the controller comprises computer readable media for performing a gas-modulated cyclic process for more than three cycles is provided. The computer readable media comprises computer instructions for performing a protective layer forming phase using the first gas chemistry with the deposition gas chemistry, wherein the protective layer forming phase is performed in about 0.0055 to 7 seconds for each cycle, comprising, computer instructions for providing the deposition gas and computer instructions for forming a plasma from the deposition gas. The computer readable media further comprises computer instructions for performing an etching phase for etching the feature through the etch mask using the second gas chemistry using a reactive etching gas chemistry, where the first gas chemistry is different than the second gas chemistry, where the etching phase is performed in about 0.005 to 14 seconds for each cycle, comprising computer instructions for providing the reactive etching gas and computer instructions for forming a plasma from the reactive etching gas.

In another embodiment of the present invention, a method for etching a feature in a layer through an etch mask over a substrate is provided. A gas-modulated cyclic process is performed for more than three cycles. Each cycle comprises performing a first etching phase, wherein the first etching phase is performed in about 0.0055 to 14 seconds for each cycle. The first etching phase comprises providing a first etch gas and forming a plasma from the first etch gas. Each cycle further comprises performing a second etching phase, wherein the second etching phase is performed in about 0.005 to 14 seconds for each cycle. Each second etching phase comprises providing a second etch gas that is different than the first etch gas and forming a plasma from the second etch gas.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

It is believed that forming protective layers, such as sidewall passivation layers that are on the order of 10 nm thick or greater and then etching, while using the protective layers as a passivation layer, may cause striations and faceting. Without being bound by theory, it is believed that layers of such thickness are not sufficiently conformal to provide desired protection against striation. It is believed that the thin protective layers provided by the invention significantly reduce striation. Such a thin protective layer may also reduce faceting. It is also believed that this reduces CD enlargement, providing CD control or control of CD bias, where CD bias is defined as CD change during etch.

The invention is a new etching method in which an in-situ gas-modulated cyclic etch process alternates between a protective layer formation phase and an etch phase to enhance the overall etch performance without unduly sacrificing simplicity and cost-effectiveness. The modulation specifically includes cyclic variation of the composition and/or flow ratios of the process feed gases, and may also include synchronized variations in the RF power, gas pressure, and temperatures. The cyclic process is characterized by a total cycle time and by the cycle time ratio, which is the ratio between time for the protective layer formation phase and the time for the etch phase.

U.S. patent application Ser. No. 10/295,601, entitled "METHOD FOR PLASMA ETCHING PERFORMANCE ENHANCEMENT, by Huang et al., filed on Nov. 14, 2002 and incorporated by reference for all purposes, discloses that an in-situ plasma process may be used to enhance and/or repair the mask and/or the vertical sidewalls of etching features, during the etching progression. In such a process, a plasma chemical process step is initiated for a short duration before and/or after the wafer is exposed to an etching plasma for a desired duration.

In the present invention, this approach is modified such that the process step responsible for protecting the mask and sidewalls is introduced as one phase of a gas-modulated cyclic process, in alternation with a compatible etch phase.

The protective layer formation process may be chosen in such a way that a thin film of material is formed on the surfaces of the mask and/or the sidewalls of the film being etched to prevent etch erosion, faceting, and striation. This thin coating may be of a material that is compatible with later stripping process for ease of final removal but more etch resistant than the mask materials. For example, a carbon-rich thin film, containing very low to no amount of other elements, may be used to coat a photoresist mask so that protected mask features are not easily eroded by the subsequent etching process. In other words, it may change the surface composition of the mask pattern such that the mask behaves like a pseudo hardmask, having certain beneficial etching characteristics of an amorphous carbon hardmask. Alternatively, the layer forming process may also be used in such a way that the formation of the thin coating on the mask pattern largely compensates for and/or repairs the mask patterns damaged/eroded by the prior etch process. The relative inertness of the coating to the subsequent etching reaction is beneficial so as to not to alter the fine balance obtained in the etching step. Alternatively the thin coating may be produced using process conditions which provide a smooth conformal coverage of sidewalls, preventing the initiation of striations due to rough and/or corrugated sidewall polymer coatings.

The etching gas mixture may contain etchant species and a passivation species so as to not lose the benefits associated with a passivation gas in the etching chemistry. The ratio of the etching to passivation components, along with a plurality of other processing conditions, is finely balanced to achieve optimum processing results, such as photoresist selectivity, etching anisotropy and etching rate etc. The electrical discharge power may be kept high and the energy of the charged particles is also kept high to obtain high etch rate and good etching anisotropy in small dimensional structures. The protective layer formation and etching cycle is repeated a large number of times until the completion of the etching task.

Figure 3:
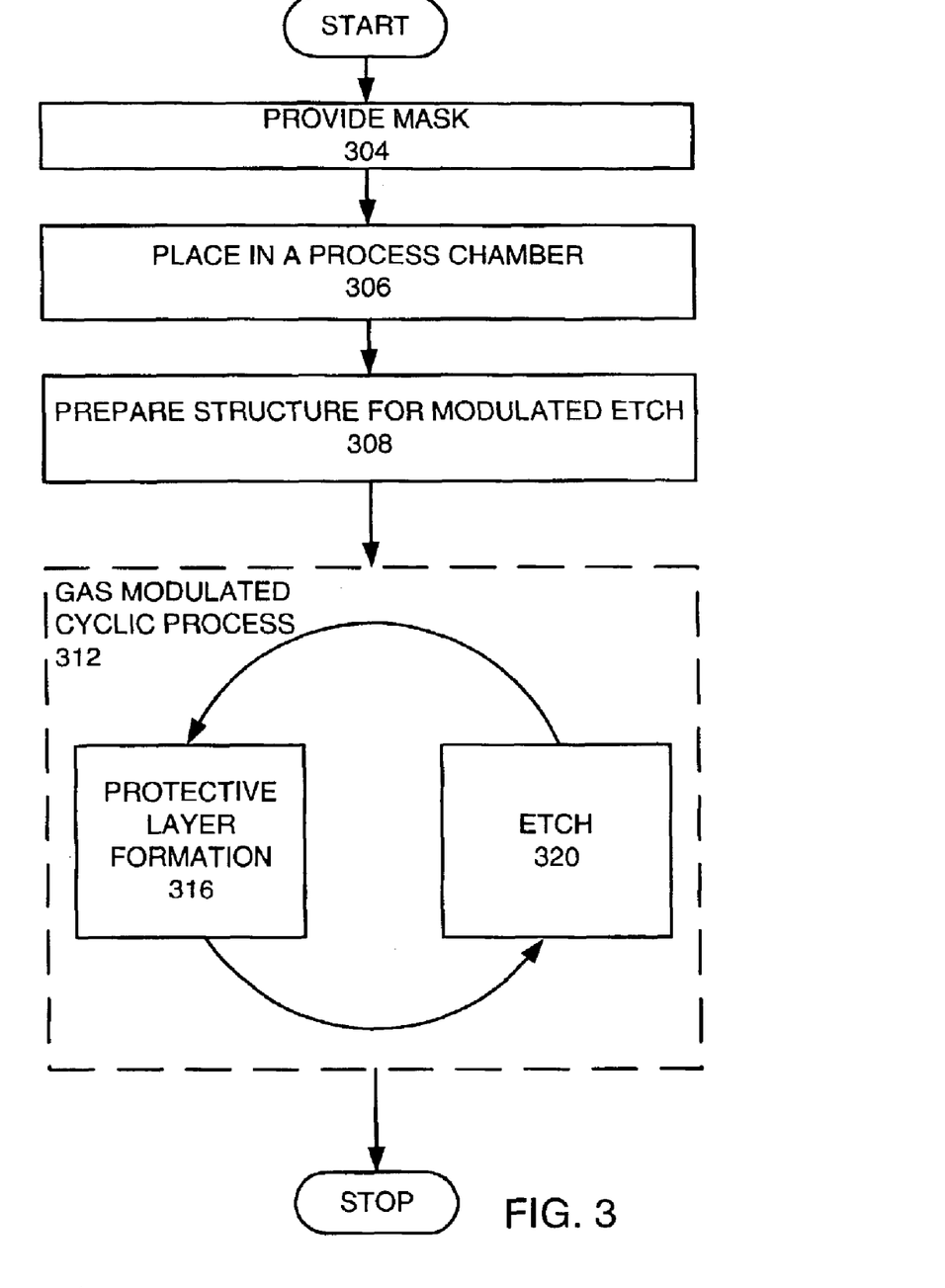
FIG. 3 is a flow chart of an embodiment of the invention.
Figure 4A:
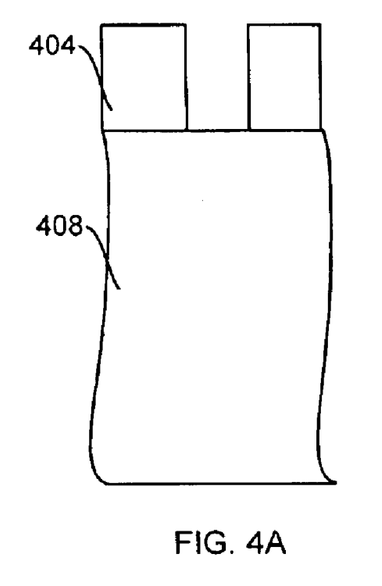
FIGS. 4A–F are schematic views of the formation of a contact hole using the inventive process.

To facilitate understanding, FIG. 3 is a flow chart of an embodiment of the invention. A mask is provided on a layer to be etched (step 304). The mask may be a photoresist mask, a hard mask, or a stacked mask. FIGS. 4A–F are schematic illustrations of the process. FIG. 4A shows a photoresist mask 404, which has been provided on an oxide layer 408 to be etched, which is on a substrate. The substrate is placed in a process chamber (step 306).

Figure 5:
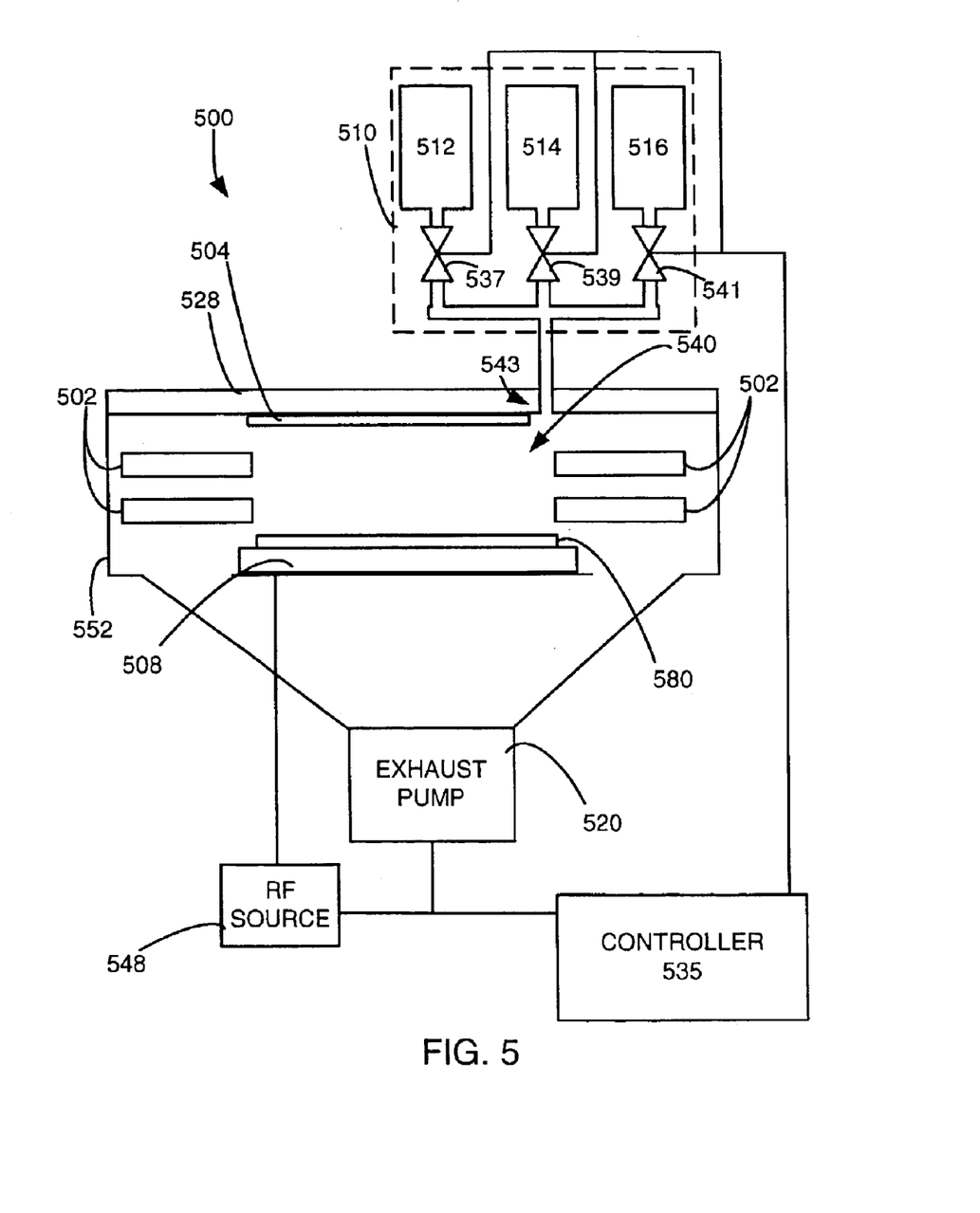
FIG. 5 is a schematic view of a system that may be used in practicing the invention.

FIG. 5 is a schematic view of a process chamber 500 that may be used in the preferred embodiment of the invention. In this embodiment, the plasma processing chamber 500 comprises confinement rings 502, an upper electrode 504, a lower electrode 508, a gas source 510, and an exhaust pump 520. The gas source 510 comprises a protective layer gas source 512, an etchant gas source 514, and an additional gas source 516. Within plasma processing chamber 500, the substrate wafer 580, over which the oxide layer is deposited, is positioned upon the lower electrode 508. The lower electrode 508 incorporates a suitable substrate chucking mechanism (e.g., electrostatic, mechanical clamping, or the like) for holding the substrate wafer 580. The reactor top 528 incorporates the upper electrode 504 disposed immediately opposite the lower electrode 508. The upper electrode 504, lower electrode 508, and confinement rings 502 define the confined plasma volume 540. Gas is supplied to the confined plasma volume by gas source 510 through a gas inlet 543 and is exhausted from the confined plasma volume through the confinement rings 502 and an exhaust port by the exhaust pump 520. The exhaust pump 520 forms a gas outlet for the plasma processing chamber. An RF source 548 is electrically connected to the lower electrode 508. Chamber walls 552 define a plasma enclosure in which the confinement rings 502, the upper electrode 504, and the lower electrode 508 are disposed. The RF source 548 may comprise a 27 MHz power source and a 2 MHz power source. Different combinations of connecting RF power to the electrodes are possible.

An 2300 Exelan™ dielectric etch system made by Lam Research Corporation™ of Fremont, Calif. modified to provided the cycle time required by the invention may be used in a preferred embodiment of the invention. A controller 535 is controllably connected to the RF source 548, the exhaust pump 520, a first control valve 537 connected to the deposition gas source 512, a second control valve 539 connected to the etch gas source 514, and a third control valve 541 connected to the additional gas source 516. A showerhead may be connected to the gas inlet 543. The gas inlet 543 may be a single inlet for each gas source or a different inlet for each gas source or a plurality of inlets for each gas source or other possible combinations.

The structure is then prepared for a modulated etch (step 308). Such preparation may comprise steps such as opening a BARC layer.

A gas-modulated cyclic etch process is then carried out (step 312). During the gas-modulated cyclic etch process, the process chamber 500 modulates between at least two phases. One phase is a step optimized to form a protective layer (step 316). The other phase is a step optimized for etching (step 326). The alternation between these phases is achieved by synchronized modulation of gas flow rates, and possibly RF power, surface temperature, and gas pressure. In the preferred embodiment, a total cycle time is not greater than about 21 seconds. More preferably, a total cycle time is performed in 0.01 to 10 seconds. Most preferably, a total cycle time is performed in 0.5 to 5 seconds. Preferably, the cycle time ratio (protection:etch) is between 0.01 and 20. More preferably, the cycle time ratio (protection: etch) is between 0.05 and 5. Most preferably, the cycle time ratio (protection:etch) is between 0.2 and 1. Preferably, the gas modulation is carried out for between about 3 to 50,000 cycles. More preferably, the gas modulation is carried out for about 20 to 1000 cycles. Most preferably, the gas modulation is carried out at least about 100 cycles.

Figure 4B:
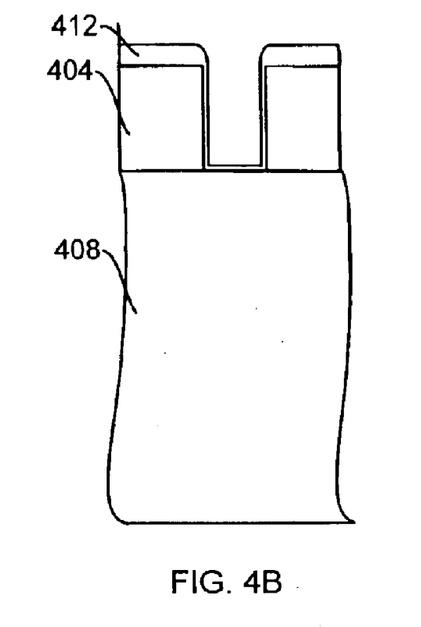

During a phase optimized to form a protective layer (step 316), a protective layer is deposited on side walls of the etched features and possibly on top of the etch mask. The deposition may be asymmetric so that the amount of deposition is formed preferentially more on the masking material than on the sidewalls. This may be aided by the line-of-sight of the location to the deposition source as well as by the selective nature of the chosen deposition process. In other words, the deposition chemistry may be chosen in such a way that a coating is formed preferentially on the masking materials due to differences in the chemical reactivity of the materials. As can be seen in FIG. 4B a thicker protective layer 412 is formed on the top of the photoresist mask 404 than on the exposed oxide surface at the bottom of the photoresist mask and on the sidewalls of the photoresist mask. It should be noted that other dimensional relationships of the drawings may not necessarily be to scale. For example, the thickness of the protective layers compared to the thickness of the mask and etched layer, may not be to scale, but such protective layers may be drawn thicker for clarity. In the preferred embodiment, the deposition is done in-situ in an etch chamber using a plasma enhanced chemical vapor deposition (CVD) process, which deposits a thin protective layer on the sidewall of the photoresist. The deposition process may apply some ion bombardment energy to allow for selectivity of such deposition. In such a process the thickness of the sidewalls may be about two thirds the thickness of the layer on top of the mask.

In other embodiments, the processing conditions may be changed as the etch front progresses through the material being etched to vary the thickness and spatial distribution of the protective layer. For example, it may be desirable to form a thicker coating on the sidewall of the film being etched as the etching proceeds deeper in order to protect the sidewalls from further distortion by the subsequent etching. A variation of cyclic processing conditions as the etch proceeds may provide for this. Since the layer forming and etching are separate phases of the cycle, the process conditions for the layer forming phase may be optimized for this result without interfering with the etch phase. Alternatively the total cycle time and/or cycle time ratio may be adjusted as the etch proceeds to provide this variation, without any change to the process parameters for the individual phases. In another preferred embodiment, the protective layer may be only deposited on the sidewalls.

During the protective layer formation phase, the fluorine-to-carbon ratio of the deposition gas is not greater than 2:1. Examples of deposition chemistries that may be used for plasma enhanced CVD may be, but are not limited to, $CH_3F$, $CH_2F_2$, $C_2H_5F$, $C_3H_7F$, $C_2H_3F$, $CH_4$, $C_2H_4$, $C_2H_6$, $C_2H_2$, $C_3H_8$, and $SiH_4$, $Si(CH_3)_4$, $Si(C_2H_5)_4$. It is preferred that these chemicals are halogen free or have a halogen to carbon ratio of no greater than 2:1. Without being limited by theory, it is believed that the carbon based chemistry forms a thin etch resistant amorphous carbon layer. The silane $SiH_4$ would be used to form an amorphous silicon layer (or polycrystalline silicon layer) over the photoresist. In addition, the protective layer may have been modified with the presence of some F and H components. The presence of other elements, such as F, may be used to yield selective activity on different material surfaces such that deposition occurs preferentially on one but not the other materials, such as on the photoresist mask materials but not on $SiO_2$ layer, under appropriate ion bombardment. Other methods, such as sputtering, may be used to form the protective layer.

To accomplish the gas-modulated cyclic processing, synchronized control of the etch system parameters may be implemented as follows. To initiate the protective layer formation phase at the start of a cycle, the controller 535 may cause the first valve 537 to allow a deposition gas from the deposition gas source 512 into the process chamber 500, while causing the second valve 539 to prevent etching gas from the etchant gas source 514 from entering the process chamber. The controller 535 may also control the power supplied by the RF source 548 and the exhaust pump 520 in synchronization with the valve controls. The controller may also be used to control the gas pressure in the wafer area, wafer backside He cooling pressure, the bias on the substrate, and various temperatures in synchronization with the valve controls. Table I is a table of some of the parameters that may be used in a protective layer formation phase of a cyclic process in the preferred embodiment of the invention.

TABLE I

|  | Preferred Range | More Preferred Range | Most Preferred Range |
| --- | --- | --- | --- |
| Bias Voltage | >50 volts | >100 volts | >300 volts |
| Bias Energy | >50 eV | >100 eV | >300 eV |

The bias may be provided by placing a constant voltage between an upper electrode above the substrate and a lower electrode below the substrate. In the preferred embodiment, an electrical negativity can be formed on the substrate holding the wafer materials (thereby applying a bias to the wafer) by applying a radio frequency (RF) voltage supplied by an RF power generator. This has the effect of drawing the positively charged particles towards the electrically biased substrate at an energy determined by the electrical negativity controlled by the amplitude of the RF voltage. It is, therefore, possible to supply and vary the ion bombardment energy by controlling the RF power (and hence the RF voltage) applied to the substrate holder.

The protective layer formation phase 316 is an independent phase in the cyclic etch process 312 which may include different combinations of deposition gases as required for different etching applications of different materials, where the deposition may provide a protective coating around the etching features including the masking features. Preferably, the time of the cycle devoted to this phase is about 0.005 to 7 seconds. More preferably, the time of the cycle devoted to this phase is about 0.05 to 5 seconds. Most preferably, the time of the cycle devoted to this phase is about 0.25 to 2.5 seconds. Preferably, a layer with a thickness of less than 100 Å is formed on the top and/or sidewalls over the duration of a single protective layer formation phase. More preferably, a layer between about 0.1 and 50 Å is formed on the top and/or sidewalls over the duration of a single protective layer formation phase. Most preferably, a layer between about 1 and 10 Å is formed on the top and/or sidewalls over the duration of a single protective layer formation phase. In the case of less than about 10 Å layer thickness, the coverage may more accurately be described as a fraction of a monolayer. In one embodiment, the protective layer forms a single monolayer over the duration of a single protective layer formation phase. In another embodiment, the protective layer forms a sub-monolayer, which is a layer that does not completely cover the surface with a single atomic or molecular layer but instead may provide a certain percentage (i.e. 75%) of surface coverage, over the duration of a single protective layer formation phase.

Figure 4C:
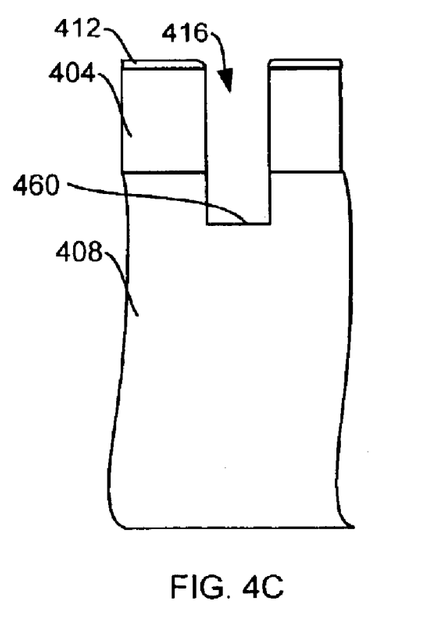

The etch phase 320 is an independent phase in the cyclic etch process 312 which is performed to advance the etch front 460, producing the etch feature 416 (step 320), as shown in FIG. 4C. Etching applications may include, but are not limited to, a dielectric contact etch, including high aspect ratio contact (HARC), damascene etch, dielectric trench etch (shallow or deep), self-aligned contact etch, gate mask open etch, via dielectric etch, dual-damascene via etch, dual damascene trench etch, conductor gate etch, conductor deep trench etch, conductor shallow trench isolation etch, and hardmask opening.

Preferably, the etch phase uses a high ion energy to provide a directional etch. The etch phase may remove some or all of the protective layer 412, as shown, over the duration of a single etch phase. All of the protective layer on some of the surfaces may be removed over the duration of a single etch phase. In this example, the protective layer forming the sidewall on the photoresist 404 and at the bottom of the feature has been removed. Other parts of the protective layer may only be partially removed. In this example, only part of the protective layer 412 on the top surface of the photoresist 404 has been removed. In other embodiments, other parts of the protective layer may be partially etched way or completely etched away. The etch phase removes some of the layer to be etched, and advances the etch front 460.

To provide the etch phase of the cycle, the controller 535 may cause the second valve 539 to allow etching gas from the etchant gas source 514 into the process chamber 500, while causing the first valve 537 to prevent deposition gas from the deposition gas source 512 from entering the process chamber. The controller 535 may also control the power supplied by the RF source 548 and the exhaust pump 520 in synchronization with the valve controls. The controller may also be used to control the gas pressure in the wafer area, wafer backside He cooling pressure, the bias on the substrate, and various temperatures in synchronization with the valve controls. The cycle continues by returning to the protective layer formation phase described above, and by repeating the alternation between phases of the cycle for as long as the cyclic etch process is required. The controller 535 may cause the third valve 541 to allow common gases from the common gas source 516 to enter the process chamber during both phases of the cycles, if there is a common gas or mixture of gases which is desired in both the protective layer formation phase and the etch phase of the cycle.

Since the etch phase of the cyclic process uses high energy ions to provide a directional etch, a polymer former gas may be provided during the etch phase. The polymer former gases may be, for example, hydrocarbons, fluorocarbons, and hydrofluorocarbons, such as $C_4F_6$, $C_4F_8$, $CH_3F$, $CH_2F_2$, $CH_4$, $C_3F_6$, $C_3F_8$, and $CHF_3$. These polymer former gases would form a polymer layer that is continuously deposited and etched during the etch phase.

Table II is a table of some of the parameters that may be used in an etch phase of a cyclic process in the preferred embodiment of the invention.

TABLE II

|  | Preferred Range | More Preferred Range | Most Preferred Range |
| --- | --- | --- | --- |
| Bias Voltage | >200 volts | >300 volts | >400 volts |
| Bias Energy | >200 eV | >300 eV | >400 eV |

Preferably, the time of the cycle devoted to this phase is about 0.005 to 14 seconds. More preferably, the time of the cycle devoted to this phase is about 0.05 to 7 seconds. Most preferably, the time of the cycle devoted to this phase is about 0.25 to 2.5 seconds. Preferably the depth of the etch increases by less than 500 Å over the duration of a single etch phase. More preferably, the depth of the etch increases by between about 5 and 250 Å over the duration of a single etch phase. Most preferably, the depth of the etch increases by between about 10 and 50 Å over the duration of a single etch phase. In the case of a change in etch depth of less than about 10 Å in a single etch phase, this change may more accurately be described as a fraction of a monolayer of material removed during a single etch phase. In one embodiment, the amount of material removed over the duration of a single etch phase is about one monolayer. In another embodiment, the amount of material removed over the duration of a single etch phase is a less than one monolayer.

The depth of the feature in the figures may not be according to scale. For example, the depth of the etch may be shown much greater than the actual etch depth, since the small etching changes per cycle may be difficult to illustrate.

Figure 4D:
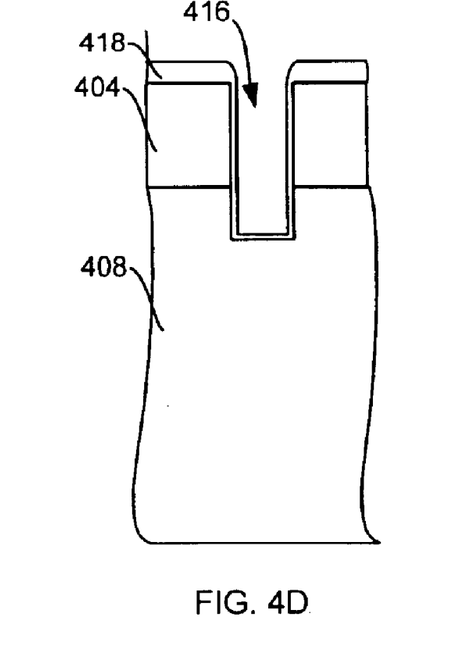
Figure 4E:
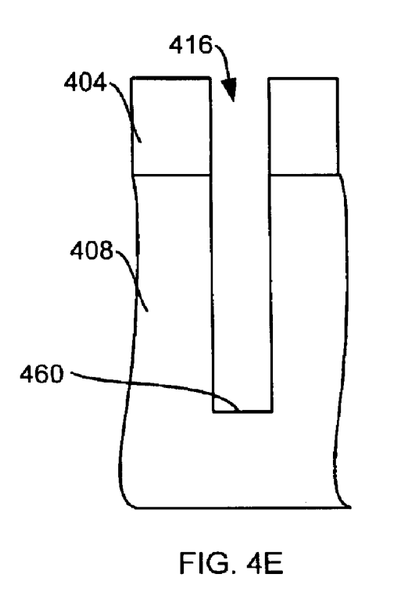

The cyclic process is repeated over many cycles. An additional protective layer 418 is deposited on the photoresist mask, as shown in FIG. 4D. In this example, the remaining part of the old protective layer becomes part of the new protective layer 418. The feature is then further etched through the photoresist mask (step 312), providing a deeper contact hole 416, as shown in FIG. 4E. Preferably, this gas-modulated cycle or loop of providing alternating deposition and etching phases is repeated more than 3 times. More preferably, this cycle is repeated more than 20 times. Most preferably, this cycle is repeated at least 100 times.

Figure 4F:
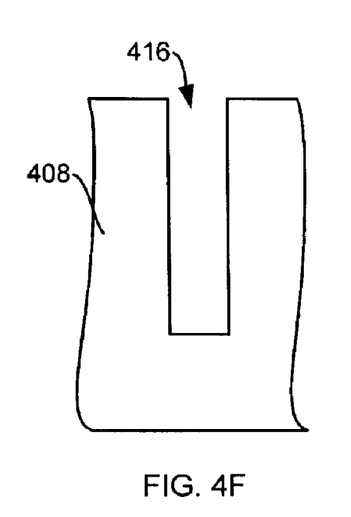

When no further etching is desired, the gas-modulated cyclic process (step 312) is complete. In the last cycle, the etching phase may completely etch away the protective layer, as shown in FIG. 4E. However, a subsequent processing step after the cyclic etch process may also be used to remove the protective layer and/or complete the etch of the oxide layer 408. Further process steps, such as stripping the photoresist mask may be performed to yield the oxide layer 408 with a contact hole 416, as shown in FIG. 4F. The photoresist mask may be stripped in the process chamber 500 or after removal from the process chamber 500. Further process steps may also be required to remove a film at the bottom of the contact hole.

In an alternative embodiment, the gas-modulated cyclic process may be terminated before the oxide etch is completed, allowing the incorporation of a conventional etch step to complete the etch. This may be desirable as a means of controlling selectivity to the stop layer underlying the oxide layer.

Examples of materials for the photoresist mask may include, but are not limited to the newer generation of photoresists, such as, deep UV photoresist, 193 nm photoresist, 157 nm photoresist, EUV photoresist, e-beam photoresist, and x-ray photoresist. The older generation of photoresist polymer materials are designed to contained unsaturated C—C bonds, such as the C—C double bond and phenolic groups to provide the required high etching resistance, namely, chemical inertness to the etching gas mixture. These bonds are strong and require a high activation energy to break and therefore, at relatively low ion energies, the older generation photoresist can show remarkably low etching rate to the etching gas mixture. The newer generation of photoresist, including 193 nm and 157 nm, may not contain these unsaturated bonds because these unsaturated bonds absorb at the lithography exposure wavelength. The absence of these unsaturated bonds leads to much reduced photoresist etching resistance. By providing protective coatings on the photoresist during the cyclic process etch, the etching resistance of the photoresist is much improved, even at high ion bombardment energy. The high ion bombardment energies at which the invention may improve etching resistance of the photo resist may be 50–2,000 eV. More preferably the ion bombardment energy may be 200–1,500 eV. Most preferably, the ion bombardment energy is 500–1,000 eV.

Without being bound by theory, it is believed that cyclic processing provides a different processing regime, because the properties of extremely thin films, deposited and etched in short timescales, are different from the properties of thicker films. Using the gas-modulated cyclic processing approach, with short cycle times, an extremely thin protective layer is deposited, such as a sidewall film or film on the top photoresist surface. This film and the oxide film are subsequently etched in very small amounts during the next phase of the cycle. The thin protective layer thickness may be in the monolayer range (i.e. sub-monolayers, monolayers, or layers of a few atoms or molecules).

The production of thin protective layers in the monolayer range is dependent on the deposition rate times the deposition time. Various deposition rate and deposition time combinations may be used to provide a thin protective layer in the monolayer range. For example, a deposition that provides a sidewall deposition rate of approximately 1 nm/sec and a top surface deposition rate of approximately 2 nm/sec provides a monolayer range thin protective layer with an approximately 0.5 nm thickness, when the deposition step is for 0.25–0.5 seconds per cycle. (i.e. a 1 nm/sec deposition rate ×0.5 seconds=0.5 nm deposition.). The same monolayer range may be achieved by increasing the deposition rate and decreasing the cycle time or by decreasing the deposition rate and increasing the cycle time. This flexibility provides additional control variables.

Without being bound by theory, it is further believed that as the thickness of the protective film approaches the dimensions of the constituent molecules, e.g. approaching monolayer coverage, the film may adopt chemical and physical properties which are distinct from bulk properties of the protective film. In this regime the concept of a thin film may no longer be applicable and it may be more accurate to consider the mixture of chemical species present in the surface and near-surface region of the material. Such species may be present as loosely bound physisorbed species, as more tightly bound chemisorbed species, or as parts of larger structures, e.g. polymer molecules, glasses, or bulk crystals. These surface and near-surface species will include protective species deposited during the protective layer phase of cyclic processing, but may also include species deposited or evolved during the etch phase of the cyclic process, as well as other species from the original substrate or arising from chemical reactions between the various species. The unique properties in the approximate monolayer regime may result from the interaction of these different surface and near-surface species with each other and with the substrate material. These interactions would be suppressed in the case of a thicker protective film, which would cover the substrate with several monolayers or more in each protective layer phase, and therefore expose only the surface of the protective material by the time the next etch phase begins.

Without being bound by theory, it is further believed that in the extreme where surfaces are receiving limited flux within each cycle, corresponding to submonolayer coverage during each individual protection and etch phase, a truly novel process regime is achieved. In this case, the concept of alternating process steps becomes inaccurate at a microscopic scale, even though it is actually being used to control the process. At a microscopic scale, the surface reactions will proceed based on the arrival and departure of species and the chemical reactions of these species. Reactions occur continually but are punctuated by the occasional impact of an energetic species, such as an ion, which can drive hyper-thermal reactions. Most of the critical reactions occur during these brief instants of excitation. In the submonolayer regime of cycling, the surface sees a quasi-steady state where the flux of reactants reaching the surface is essentially an average of the two different plasma conditions, with reactions occurring between the mixture of these species.

It is believed that this is a fundamentally different regime from traditional, single-step, steady state etching, because the mixture of species reaching the surface is produced from two distinct plasma conditions. If the process conditions of the phases of the gas-modulated cyclic process were combined into a single steady-state recipe step, the resulting time-averaged flux of species reaching the surface would be modified due to the interaction of the different gases in the plasma. It is believed that by separating the plasma conditions in time with gas-modulated cyclic processing, the overall mixture of species reaching the surface can be controlled to an unprecedented degree. Conditions for the two different phases of the cycle can be very different, due to the ability to modulate the gas chemistry. As a result, very different chemical species can be produced in the different phases of the cycle, to achieve a mixture which might be impossible with a single-step steady-state process. This mixture is the linear combination of fluences from the two discrete plasma conditions produced by the alternating phases of the cycle. The ratio of these fluences is controlled by the cycle time ratio. The cycle time ratio therefore becomes an additional process control variable.

The gas-modulated cyclic processing approach is able to provide a regime of near-monolayer and sub-monolayer coverage (monolayer range) that is accessible in the short cycle time regime. By increasing the cycle time sufficiently, the regime of bulk protective layers, with thicknesses of many monolayers, alternating with sustained etch conditions, may also be accessed. Between these two extremes of cycle time, a continuum of behavior may be accessed, to allow the balancing of desirable and undesirable results characteristic to the two extremes of the approach. Therefore, the inventive gas-modulated cyclic processing provides the flexibility to provide all of these regimes in this continuum. The total cycle time therefore becomes an additional process control variable.

Figure 8A:
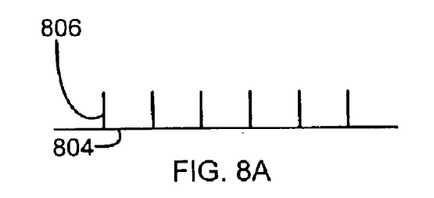
FIGS. 8A–E schematically illustrate the build up of material on a surface in an inventive regime of fast cycling using submonolayers.
Figure 8B:
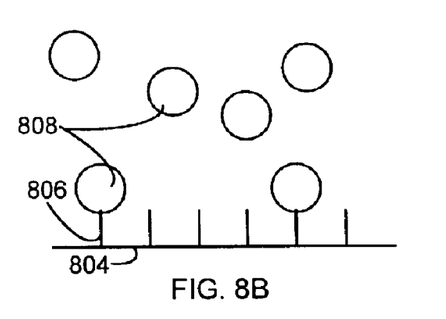
Figure 8C:
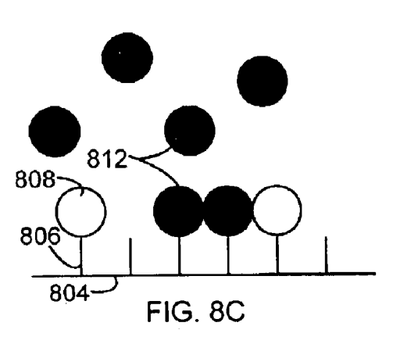
Figure 8D:
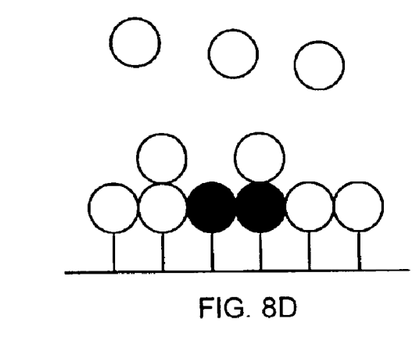
Figure 8E:
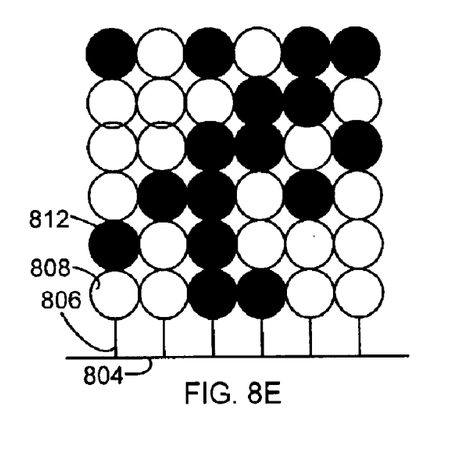

FIGS. 8A–E schematically illustrate the build up of material on a surface in the regime of fast cycling using submonolayers. In this example, each phase of the cyclic process is adding species to the surface sites, but different species are produced in the different phases. This is indicated by the alternation between black and white circles above the surface for the different phases. These circles represent depositor molecules in the gas phase and on the surface. In FIG. 8A, an initial sidewall surface 804 is shown with surface sites 806 unoccupied. FIG. 8B shows the effect of the first phase of the cyclic process, where a first species 808 of depositor molecules produced by the plasma conditions of the first phase are deposited on surface sites 806 of the surface 804. Note that not all surface sites 806 are occupied during the first application of the first phase. FIG. 8C shows the effect of the second phase, where a second species 812 depositor molecules produced by the plasma conditions of the second phase, which are different from the first species 808 of depositor molecules of the first phase due to the modulation of gas chemistry and possibly other process parameters. Less than one monolayer is added to the surface coverage in this application of the second phase. FIG. 8D shows the effect of the next application of the first phase of the cyclic process. In this application, monolayer coverage is completed and a second layer begins to form. FIG. 8E shows the result after several cycles, which is a mixed film with each layer composed of the different species 808, 812 produced in the first and second phases.

Figure 9A:
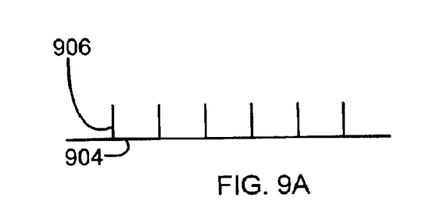
FIGS. 9A–D schematically illustrate the build up of material on a surface in the regime of slower cycling.
Figure 9B:
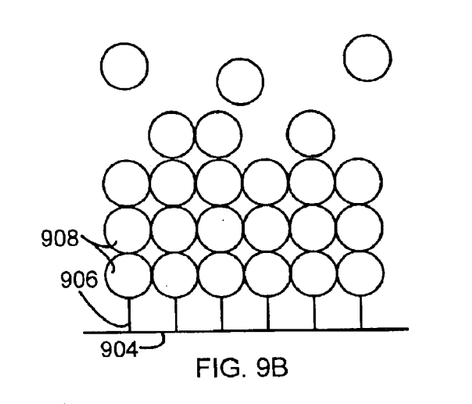
Figures 9C, 9D:
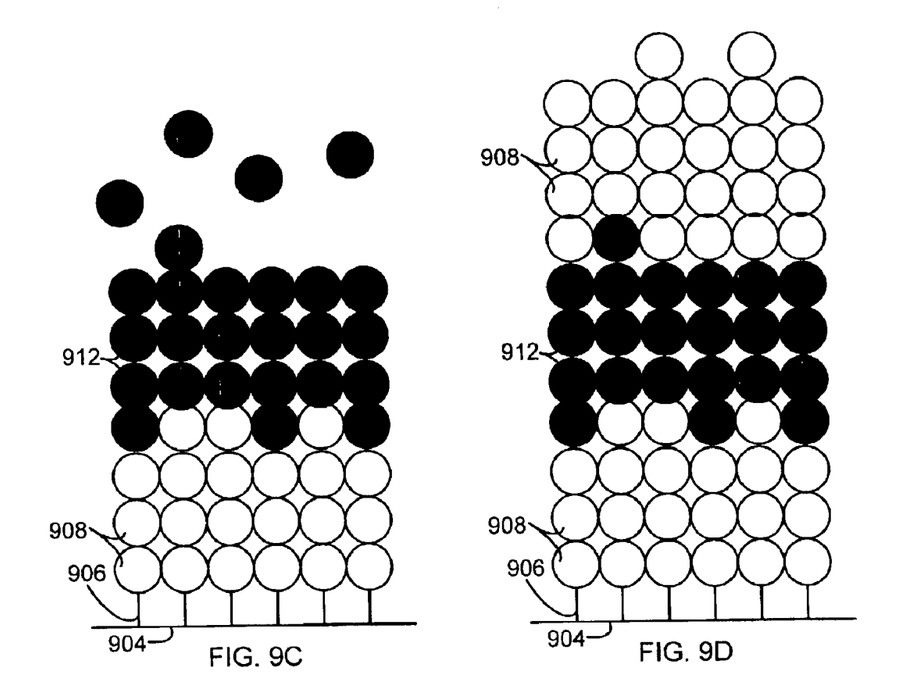

FIGS. 9A–D schematically illustrate the build up of material on a surface in the regime of slower cycling. This is achieved by the same conditions of the example in FIGS. 8A–E, with only the total cycle time increased by roughly a factor of ten. In FIG. 9A an initial surface 904 is shown with surface sites 906 unoccupied. FIG. 9B shows the effect of the first phase of the cyclic process, where a first species 908 of depositor molecules produced by the plasma conditions of the first phase are deposited on surface sites 906 of the sidewall surface 904. In this case, several monolayers of surface coverage are added during the first application of the first phase. FIG. 9C shows the effect of the second phase of the cyclic process, where a second species 912 of depositor molecules produced by plasma conditions of the second phase are deposited on the layer formed by the first species 908 of depositor molecules. Several monolayers of surface coverage are added during the first application of the second phase. FIG. 9D shows the result after one- and-one-half cycle, where is an alternating stack of two different films, with multilayer film composed of layers of the first species 908 and the second species 912, each produced during a single phase of the cyclic process.

These examples are presented to show the qualitatively different microscopic results which may be achieved as the total cycle time becomes comparable to the time required to deposit a single monolayer of the surface. It is believed that the different surface films produced in these two examples may correspond to different process results on the wafer structures, based solely on the variation of total cycle time. This is a simple example, with deposition as the only surface mechanism, but similar arguments could be applied to a more complex combination of surface mechanisms. For example, a surface which is alternately exposed to depositor and etchant species by the alternating phases of the cyclic process could also exhibit modified behavior when the total cycle time becomes comparable to the time required to deposit or etch a single monolayer of the surface.

As discussed above, it is believed that by using alternating protective and etching steps, striation and faceting may be reduced and better etch control may be provided. Without being bound by theory, it is believed that the regime of near-monolayer and sub-monolayer protective coverage which is accessible through gas-modulated cyclic processing and the protective capabilities of the alternating approach may be controlled and modified to provide unique properties that may help to reduce striation and faceting and provide better etch control.

The layer to be etched may be a dielectric layer (such as silicon oxide), a conductive layer (such as metal and silicon or other type of semiconductors), a hardmask layer (such as silicon nitride and silicon oxynitride), or a barrier layer (such as silicon nitride or silicon carbide). For etching a conductor layer, halogens, such as chlorine, fluorine, or bromine, may be used in the etching step, where the deposition may contain chemicals used to deposit a carbon-rich thin film or a thin film containing Si. Preferably, the layer to be etched is a dielectric material such as silicon oxide, doped silicate glass, or a low-k dielectric film such as organosilicate glass or SiLK.

The gas-modulated cyclic processing step may be carried out by using the same carrier gas flow for both forming the protective layer and etching, while reactants for forming the protective layer and reactants for etching are alternately provided. In addition, the RF power, temperature, and/or pressure may be pulsed in synchronization with the gas flows to provide optimal conditions for each phase in the gas-modulated cyclic process.

In another embodiment the entire gas mixture of carrier gases and reactants are alternated. Again, the RF power, temperature, and/or pressure may be pulsed in synchronization with the gas flows to provide optimal conditions for each phase in the cyclic process. In another embodiment, the same gases may be used for both phases, but the relative flow ratios are changed for each phase. Therefore, to provide a different gas chemistry between two different phases of the gas-modulated cyclic process, one could use two entirely different gases, or use the same carrier gas and different active gases, or use the same gases with different relative flows.

In an example of different gas chemistries using the same carrier gas flow for both forming the protective layer and etching, the etchant gas from the etching gas source is not provided to the plasma processing chamber during the protective layer formation phase. This may be done by not providing a component of the etching gas or deposition gas. For example, oxygen or an oxygen containing gas is a key etching component to an etching gas. Even though $C_4F_6$ is also used in the etchant gas, etching cannot be accomplished by $C_4F_6$ without oxygen in this example. Therefore, by not providing oxygen or an oxygen containing gas during the protective layer formation phase is a method of not providing the etching gas during the protective layer formation phase, even if $C_4F_6$ is provided during the formation of the protective layer. It is also preferred that the formation of the protective layer process is a non-etching or negligently etching at most (comprising less than 10% of the layer to be etched) for forming the protective coating. Such a deposition process may be, but is not limited to, plasma enhanced CVD deposition or sputtering, since CVD and sputtering are not used for etching. If the deposition gas is the same as the polymer former in the etch phase, then the deposition gas may be provided during the etch phase. In addition, bias power during the etch phase may be higher to provide the directional etching.

Providing a separate deposition phase and the presence of the polymer former to provide polymerization during the etch phase allows the use of higher energy etching ions for higher etching rate and better anisotropic etching. By keeping passivation gases in an etch phase mixture, it is possible to use higher ion energies without unacceptable erosion and damage of the etching mask. Additionally, anisotropic etching can be achieved during the duration of the etching phase. By using cyclic process with alternating protective layer forming phases and etch phases, mask protection can be optimized. This approach avoids inter-reactions of etching and retardation gases in the discharge. For example, a deposition chemical mixture may be chosen that forms a harder and more durable coating than produced by an etching mixture. Additionally, the deposition chemistry conditions, such as pressure and concentration, may be tailored to optimize the properties of the protective layer formation such as the composition and thickness.

It may be desirable that some of the components of the deposition gas are not mixed with components of the etch gas, since some mixing decreases the efficiency of having separate deposition and etch phases. As a result, the controller in such cases would synchronize the modulated gas flows so that one gas is depleted before another gas is added.

By having independent protective layer formation and etch-passivation phases, the processing conditions, such as temperature, power, pressure, ion energy, and processing gases, may be independently controlled varied to provide optimal conditions for each phase.

Argon or other inert gases may be used as carrier gases during both the etching and protective layer formation. An example of another inert gas would be neon.

In an embodiment of the invention, the chamber wall areas, which may contact the plasma (a mixture of chemicals and charged particles sustained by the electrical discharge), are made to be as small as possible and to be maintained at elevated temperatures. The object of this is to avoid the so-called chamber "memory" effect, by which the chemical elements contained in the coating of the chamber wall areas formed in one processing step can be released to interfere with the subsequent steps. By minimizing the total deposition on the chamber wall areas, this effect can be reduced, avoiding an interaction between the two different phases which may degrade the performance.

It may also be desirable that the gas travel time from the precursor source to the processing chamber is made to be very short. The gas flow stability time, denoting the time to establish a constant desired flow and the time to establish complete absence of the said gas at the processing chamber, is made to be very short so that the transition from one stable gas mixture composition to the next can be made to be very fast. The object of this is to avoid inter-mixing of chemicals between two different phases, which may degrade the performance.

It may also be desirable that the electrical system and the control network controlling the conversion of the electrical power into an electrical discharge reacts very fast with respect to the changes of the discharge conditions and power requirements. Furthermore, it may desirable to be able to quickly change and stabilize other external conditions of the processing chamber, such as the pressure of the gas mixture and the temperature of the wafer substrate. Allowing such process conditions to be changed quickly allows for a shorter total cycle time and allows the process conditions to be varied significantly between phases to optimize each phases individually. Therefore, it may also be desirable to have a computerized system that is able to control and synchronize the rapid modulation of the processing conditions. The computer system is used to send commands for the required periodic changes and to synchronize these commands using pre-determined time delays for the various devices providing the plurality of condition changes in the processing chamber.

Other embodiments of the invention may provide one or more additional phases to the cyclic process. For example, a gas-modulated cyclic process may have six phases, such as three deposition phases and three etching phases in a single cycle. The addition of additional phases may be limited by the increased complexity of each cycle.

Another embodiment may eliminate the use of a polymer providing gas during the etch phase. Another embodiment of the invention may provide two etch phases, instead of a deposition phase and etch phase. In such an embodiment, one etch phase may be an etch process condition that yields a tapered profiled, while a second etch phase may be an etch process condition that yields a bowed profile. In the regime of short cycle times, each phase of the cycle might modify less than one, roughly one, or a few monolayers of the surface being etched. In this case the alternation between two different etch phases would produce refined process control capability. Again the gas-modulated cyclic approach provides the capability to deliver a mixture of species to the surface which could not be produced by a single-step steady-state condition. And the ratio between species produced in each phase is easily controlled by the cycle time ratio. Another embodiment of the invention may provide two deposition phases and a single etch phase. Another embodiment of the invention may provide a single deposition phases and two etch phases. Another embodiment of the invention may provide a sequence of gas-modulated cyclic processes, each cyclic process distinguished by the total cycle time, the cycle time ratio, and/or the process conditions for the individual phases. These phase conditions include gas compositions, gas flows, RF power, pressure, and/or temperature.

EXAMPLE

A specific example of the invention, as applied to etching a HARC structure, uses a Exelan® HPT dielectric etch system made by Lam Research Corporation™ of Fremont, Calif. for the process chamber 500. The wafers used in this example include a 2.1 $\mu$m $SiO_2$ layer, a patterned photoresist mask, and a bottom antireflective coating (BARC) between the $SiO_2$ layer and the photoresist mask. The $SiO_2$ layer used in this example is deposited using plasma enhanced CVD with a tetraethylorthosilicate (TEOS) precursor. The photoresist mask is patterned using 193 nm photolithography, to produce a contact critical dimension (CD) of 0.16 $\mu$m or less.

In this example the preparation of the structure (step 306) for the gas-modulated cyclic etch is a BARC etch step. In this example the BARC etch step may one of many known BARC etch steps.

Upon completion of the BARC etch step, the cyclic process is performed in the Exelan HPT dielectric etch system. In this example, which uses an Exelan HPT dielectric etch system without modification, the plasma is extinguished twice in each cycle: at the end of the protective layer formation phase 316 and at the end of the etch phase 320. Extinguishing the plasma allows flexibility in the transition periods. In this case, several seconds were required to stabilize gas flows and pressures, to prepare for the next phase of processing. But with the plasma extinguished these transition have little or no impact on the process results. To allow the reignition of the plasma at the start of each etch phase, the initial 2 seconds of the etch phase utilized a higher pressure and lower RF power than the remainder of that phase. This strike portion of the etch phase is considered to be part of the overall etch phase time. In calculating the total processing time, the total cycle time, and the cycle time ratio, only the plasma-on time periods were considered. Therefore a nominally 320-second cyclic process in fact took much longer in real time to execute. This inefficient use of time is the principal shortcoming of this approach. However, this approach provides the inventive results on an unmodified system.

The protective layer formation phase 316 of the cyclic process 312 is defined by the following process parameters. The pressure in the wafer area is 120 millitorr, with 500 watts RF power applied at 27 MHz and 500 watts applied at 2 MHz. The process gas flows are 500 sccm of Argon and 30 sccm of $CH_3F$. The electrostatic chuck is placed at a temperature of 35° C. The backside chuck helium pressure is placed at 15 torr. In this example, the deposition gas source 512 would provide the $CH_3F$, which is not provided during the etching. The argon may be provided from the additional gas source 516, since argon is provided during both the deposition and etching. To initiate the protective layer formation phase, the controller 535 would open the first valve 537 and close the second valve 539. The controller would also control the flow of argon from the additional gas source. The controller 535 would control the power and other parameters as specified above.

The etch phase 320 of the cyclic process 312 is defined by the following process parameters. The pressure in the wafer area is 55 millitorr, with 1000 watts RF power applied at 27 MHz and 1800 watts applied at 2 MHz. The process gas flows are 270 seem of Argon, 9 seem of $C_4F_6$, and 10 sccm of $O_2$. The $C_4F_6$ would be a polymer former gas, which provides polymerization during the etching. The $O_2$ would be the etching enabler gas. Although the fluorine from $C_4F_6$ is used in etching, the fluorine in this example requires the presence of oxygen to enable etching. The chuck is placed at a temperature of 35° C. The backside chuck helium pressure is placed at 15 torr. In this example, the etchant gas source 514 would provide the $C_4F_6$ and $O_2$, which are not provided during the protective layer formation phase, although $C_4F_6$ without oxygen may be used for deposition. To initiate the etch phase, the controller 535 would close the first valve 537 and open the second valve 539. The controller would also control the flow of argon from the additional gas source. The controller 535 would control the power and other parameters as specified above.

In this example, first the BARC etch is performed for 50 seconds (step 308). Next, the cyclic process is performed for 320 seconds (step 312), where the plasma off periods are not counted to the time of a phase or the total cycle time. The duration of the protective layer formation phase 316 is 2 seconds. The duration of the etch phase 320 is 6 seconds, including a 2 second strike condition. Therefore the total cycle time is 8 seconds, and the cycle time ratio is 1:3 (protective layer formation phase:etch phase). The cycle is repeated 40 times. After the cyclic process is completed (step 312), the photoresist is stripped.

Figure 6:
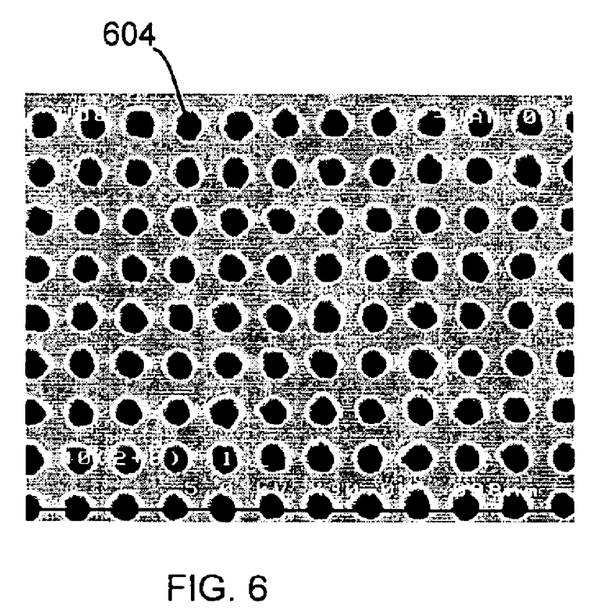
FIG. 6 is a scanning electron micrograph of a top view of results of etching a dense array of contacts using an example of the invention.
Figure 7:
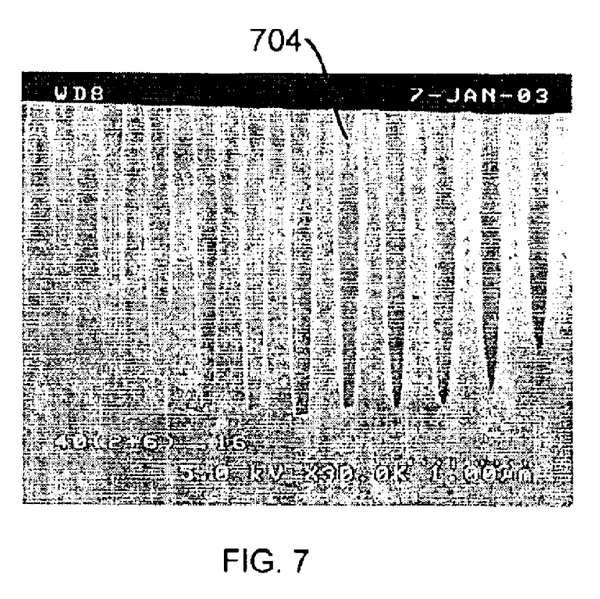
FIG. 7 is a scanning electron micrograph of a profile view of results of etching a dense array of contacts using an example of the invention.

FIGS. 6 and 7 are scanning electron micrographs, showing the results of etching in a dense array of contacts with nominal critical dimension of 0.16 μm for the contact opening. The total etch depth was not enough to reach the silicon nitride stop layer, so these results represent a partial etch process, as is often used to assess etch performance.

Note that the contacts exhibit a small degree of striations, seen as irregularity in the shapes of the circles 604. Without the cyclic processing, the striations are typically much worse for this etch application.

FIG. 7 is a profile view of etched contacts 704 after PR strip. Note that the etch profile is fairly vertical, with only slight bowing near the top. There is tapering near the bottom of the feature, as usual for a partial etch. This tapering is typically removed when a feature is etched to completion, e.g. when the stop layer is exposed. The etch depth is about 2 μm. There is no evidence of etch stop, which would be seen as some contacts exhibiting an etch depth much less than other contacts. Overall these etch results show that the cyclic process is capable of etching a high-aspect ratio contact with reasonable etch profile, low striations, and no etch stop. Although this example may not be fully optimized this example helps to show that the invention may provides a superior performance.

A preferred embodiment modifies the process apparatus so that the apparatus is able to provide a preferred process which provides a rapid gas modulation with flow stabilization times of <1 second. In such an embodiment the plasma would remain ignited for the duration of the cyclic process 312, so that there is no plasma off time.

Figure 10A:
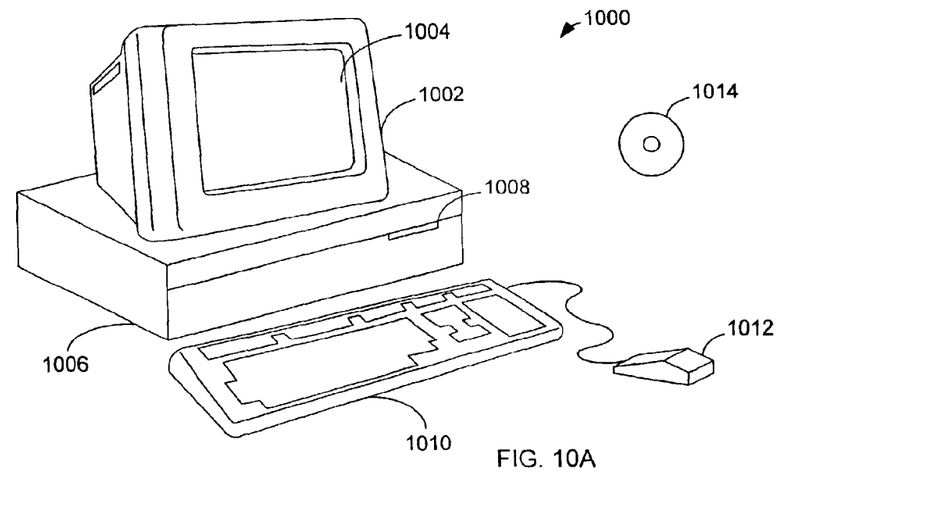
FIGS. 10A and 10B illustrate a computer system, which is suitable for implementing a controller used in embodiments of the present invention.
Figure 10B:
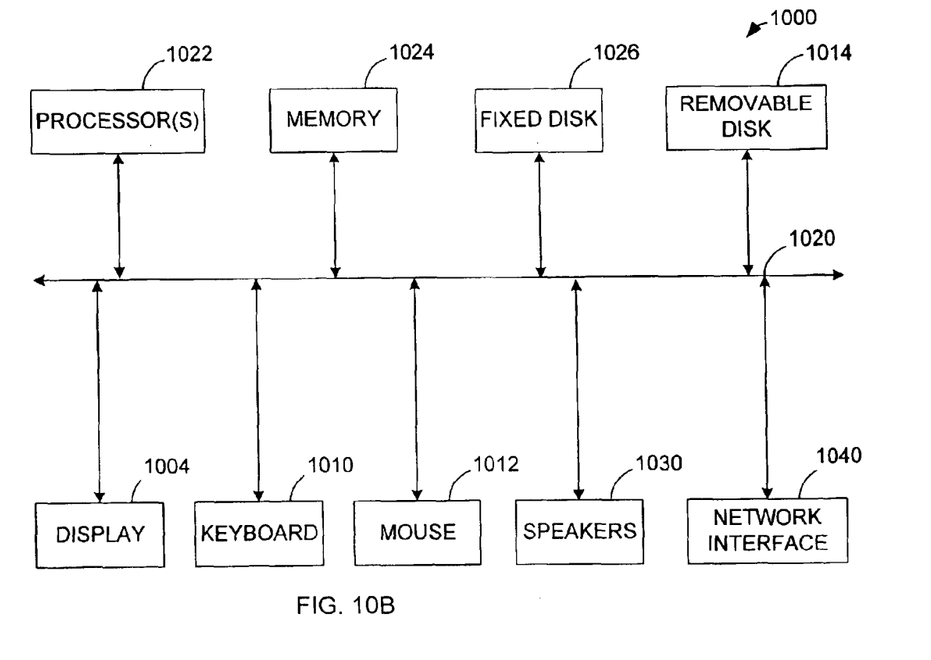

FIGS. 10A and 10B illustrate a computer system 1000, which is suitable for implementing a controller 535 used in embodiments of the present invention. FIG. 10A shows one possible physical form of the computer system. Of course, the computer system may have many physical forms ranging from an integrated circuit, a printed circuit board, and a small handheld device up to a huge super computer. Computer system 1000 includes a monitor 1002, a display 1004, a housing 1006, a disk drive 1008, a keyboard 1010, and a mouse 1012. Disk 1014 is a computer-readable medium used to transfer data to and from computer system 1000.

FIG. 10B is an example of a block diagram for computer system 1000. Attached to system bus 1020 are a wide variety of subsystems. Processor(s) 1022 (also referred to as central processing units, or CPUs) are coupled to storage devices, including memory 1024. Memory 1024 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1026 is also coupled bi-directionally to CPU 1022; it provides additional data storage capacity and may also include any of the computer-readable media described below. Fixed disk 1026 may be used to store programs, data, and the like and is typically a secondary storage medium (such as a hard disk) that is slower than primary storage. It will be appreciated that the information retained within fixed disk 1026 may, in appropriate cases, be incorporated in standard fashion as virtual memory in memory 1024. Removable disk 1014 may take the form of any of the computer-readable media described below.

CPU 1022 is also coupled to a variety of input/output devices, such as display 1004, keyboard 1010, mouse 1012 and speakers 1030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1022 optionally may be coupled to another computer or telecommunications network using network interface 1040. With such a network interface, it is contemplated that the CPU might receive information from the network, or might output information to the network in the course of performing the above-described method steps. Furthermore, method embodiments of the present invention may execute solely upon CPU 1022 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a feature in a dielectric layer through an etch mask over a substrate, comprising:
    performing a gas-modulated cyclic process for more than three cycles, wherein each cycle comprises:
        performing a protective layer forming phase using first gas chemistry with a deposition gas chemistry, wherein the protective layer forming phase is performed in about 0.0055 to 7 seconds for each cycle, comprising;
            providing the deposition gas; and
            forming a plasma from the deposition gas; and
        performing an etching phase for etching the feature into the dielectric layer through the etch mask using a second gas chemistry using a reactive etching gas chemistry, where the first gas chemistry is different than the second gas chemistry, wherein the etching phase is performed in about 0.005 to 14 seconds for each cycle, comprising:
            providing a reactive etching gas; and
            forming a plasma from the reactive etching gas.

2. The method, as recited in claim 1, wherein the protective layer forming phase forms a layer between 1 and 10 Å thick.

3. The method, as recited in claim 1, wherein the second gas chemistry contains a polymer former and an etch enabler.

4. The method, as recited in claim 1, wherein the protective layer forming phase and the etching phase are performed in a common plasma processing chamber.

5. The method, as recited in claim 1, wherein the etch mask is a photoresist mask based upon 193 nm or below photolithography.

6. The method, as recited in claim 1, wherein the performing of the gas-modulated cyclic process further comprises a third phase.

7. The method, as recited in claim 1, wherein each application of the protective layer phase forms a submonolayer.

8. The method, as recited in claim 1, further comprising adjusting the times of the protective layer forming phase and the etching phase to tune the gas-modulated cyclic process.

9. The method, as recited in claim 1, wherein the gas-modulated cyclic process is applied for more than 20 cycles.

10. The method, as recited in claim 1, wherein the gas-modulated cyclic process is applied for at least 100 cycles.

11. The method, as recited in claim 1, further comprising:
    stopping the gas-modulated cyclic process before the layer is completely etched; and
    providing a non-cyclic etch to complete etching of the layer.

12. The method, as recited in claim 1, wherein each cycle has a period between about 0.01 to 21 seconds.

13. The method, as recited in claim 1, wherein the protective layer forming phase uses a non-directional deposition and the etching step uses a directional etching.

14. The method, as recited in claim 13, wherein the non-directional deposition is selected from at least one of chemical vapor deposition and sputtering.

15. A method for etching a feature in a layer through an etch mask over a substrate, comprising:
    performing a gas-modulated cyclic process for more than three cycles, wherein each cycle comprises:
        performing a protective layer forming phase using first gas chemistry with a deposition gas chemistry, wherein the protective layer forming phase is performed in about 0.0055 to 7 seconds for each cycle, comprising;
            providing the deposition gas; and
            forming a plasma from the deposition gas; and
        performing an etching phase for etching the feature through the etch mask using a second gas chemistry using a reactive etching gas chemistry, where the first gas chemistry is different than the second gas chemistry, wherein the etching phase is performed in about 0.005 to 14 seconds for each cycle, comprising:
            providing a reactive etching gas; and
            forming a plasma from the reactive etching gas, wherein the etching phase comprises providing an ion bombardment energy of greater than 200 electron volts to the substrate.

16. A method for etching a layer over a substrate, comprising:
    performing a cyclic process for at least 3 cycles, wherein each cycle comprises:
        performing a first etching phase, wherein the first etching phase is performed in about 0.0055 to 14 seconds for each cycle, comprising;
            providing a first etch gas; and
            forming a plasma from the first etch gas; and
        performing a second etching phase, wherein the second etching phase is performed in about 0.0055 to 14 seconds for each cycle, comprising;
            providing a second etch gas, wherein the first etch gas is different than the second etch gas; and
            forming a plasma from the second etch gas.

* * * * *